United States Patent [19]

Moser

[11] Patent Number: 5,014,115
[45] Date of Patent: May 7, 1991

[54] COPLANAR WAVEGUIDE SEMICONDUCTOR PACKAGE

[75] Inventor: Lester J. Moser, Scottsdale, Ariz.
[73] Assignee: Motorola, Inc., Schaumburg, Ill.
[21] Appl. No.: 501,388
[22] Filed: Mar. 23, 1990

Related U.S. Application Data

[63] Continuation of Ser. No. 121,720, Nov. 16, 1987, abandoned.
[51] Int. Cl.⁵ .................... H01L 23/12; H01L 23/14; H01L 23/48
[52] U.S. Cl. ......................................... 357/74; 357/80
[58] Field of Search ............................ 357/80, 74, 68; 333/247, 246

[56] References Cited

U.S. PATENT DOCUMENTS

| | | | |
|---|---|---|---|
| 3,651,434 | 3/1972 | McGeough et al. | 333/247 |
| 4,551,746 | 11/1985 | Gilbert et al. | 357/74 |
| 4,608,592 | 8/1986 | Miyamoto | 357/80 |
| 4,768,004 | 8/1988 | Wilson | 333/246 |

*Primary Examiner*—Rolf Hille
*Assistant Examiner*—S. V. Clark
*Attorney, Agent, or Firm*—Maurice J. Jones; Frank J. Bogacz

[57] ABSTRACT

A package for a semiconductor device includes a base having a flat surface with an edge of a predetermined shape for abutting against a similar edge of another object. Conductors are placed on the flat surface of the base and extend to but do not overlap the edge of predetermined shape. The base along with a frame and a cover cooperate to provide a package which encloses and protects the semiconductor device. The package can be placed adjacent a similarly shaped package so that the overall structure takes up a minimal amount of space. Ground planes located on the base can be readily interconnected.

21 Claims, 4 Drawing Sheets

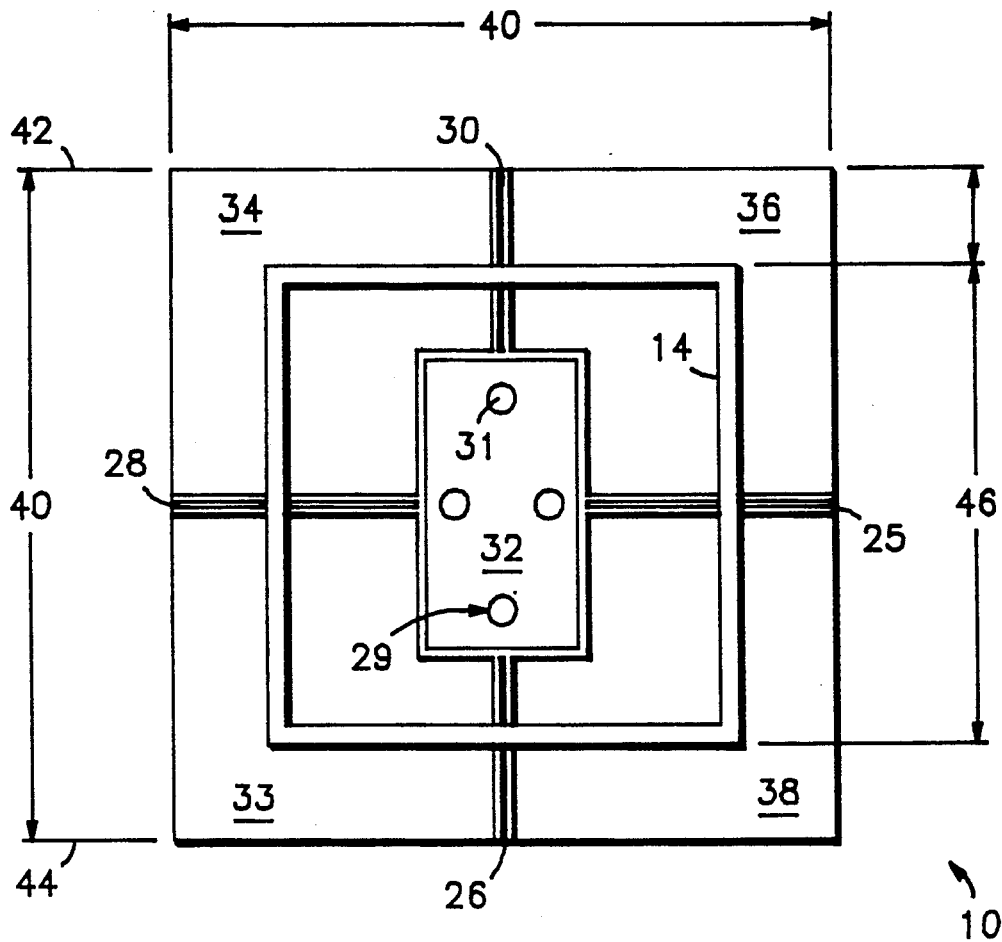
FIG. 2
FIG. 3
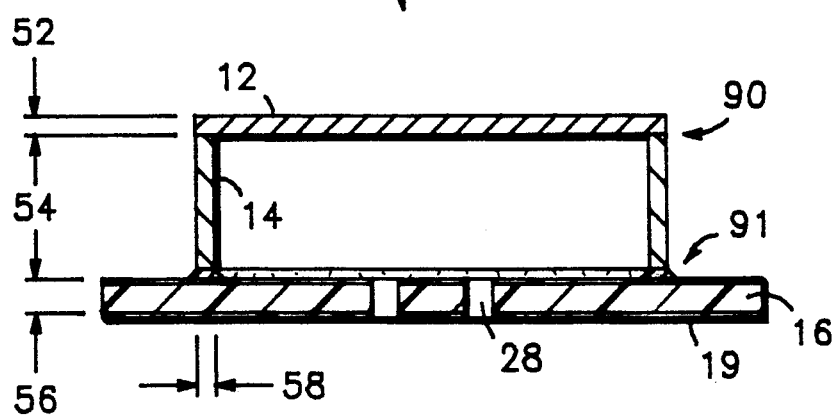

COPLANAR WAVEGUIDE SEMICONDUCTOR PACKAGE

This application is a continuation of prior application Ser. No. 121,720, filed Nov. 16, 1987, now abandoned.

BACKGROUND OF THE INVENTION

This invention relates to packages for high frequency semiconductor devices and more specifically to housings suitable for protecting Monolithic Microwave Integrated Circuit die (MMICS).

At the present time, much effort and expense is going into research and development relating to MMIC-type galium arsenide circuitry. Chips including this circuitry tend to provide advantages of high speed and high power operation while taking up minimal space. The space reduction can be as much as 50:1 as compared to other methods. These semiconductor chips are not usable for practical applications unless they can be enclosed in and protected by proper packages or housings.

Prior art packages for MMIC semiconductor chips which operate up to or even above 12 gigahertz ($GH_z$) tend to be expensive and they are generally presently available from only a limited number of suppliers. While some prior art packages allow mounting of MMIC chips within the package in a small area, the packages themselves require excessive amounts of space. This is because some such packages utilize leads that extend beyond the boundaries of the package. These leads often must be tied down to conductors on a substrate surface and then brought from the conductors on the substrate to an adjacent package. This requires that sufficient space be maintained between the prior art packages to facilitate the required electrical and mechanical connections.

Moreover, some prior art packages require that ground plane connection between devices be provided on bottom surfaces of their substrates. This complicates the construction and manufacture of products including such packages. Furthermore, some prior art packages have heat dissipating buttons for removing heat from the chips. Such buttons are difficult to reliably attach to heat sinks. Additionally, some prior art packages have leads which are only suitable for being grounded. The layout of products including such packages is thereby complicated. Furthermore, some prior art packages cost on the order of Fifty Dollars ($50.00) each which makes them unsuitable for many high quantity production items.

SUMMARY OF THE INVENTION

Accordingly, one object of the invention is to provide packages for high frequency semiconductor devices which enable compact final product configurations by allowing the packages to be mounted side-by-side with substantially no wasted space therebetween.

Another object of the invention is to provide packages for wide bandwidth, high frequency semiconductor devices operating in the gigahertz region which allows for ground plane interconnection on the top of the structure rather than on the bottom and which provides a plurality of leads.

Still another object of the invention is to provide high frequency, hermetically sealed packages for high frequency semiconductor devices which efficiently conducts heat from the semiconductor chips mounted therein.

A further object of the invention is to provide low cost, easily manufactured packages for MMIC or other high frequency semiconductors which can be placed in abutting relationship to minimize the required space.

A package for a semiconductor device in accordance with one embodiment of the invention is suitable for abutting against an adjacent object so that the resulting structure takes up a minimum amount of space. The package includes a base having a flat surface with an edge of predetermined shape for abutting against a similar edge of the other object. Conductors are provided on the flat surface of the base and extend to but do not overlap the edge of predetermined shape. A semiconductor die pad for a semiconductor die is also provided on the flat surface of the base. A frame is affixed to the base and surrounds the semiconductor die pad. A cover is affixed to the frame for covering the semiconductor die. The base, frame and cover cooperate to provide a package which encloses and protects the semiconductor die.

BRIEF DESCRIPTION OF THE DRAWINGS

A more complete understanding of the present invention may be derived by reference to the detailed descriptions and the claims considered with the accompanying drawings wherein like reference numbers designate similar parts.

FIG. 2 is a top view of the package of FIG. 1 illustrating the dimensions and the relationship of some of the parts thereof;

FIG. 3 is a cross-sectional view of the structure of FIG. 2;

DETAILED DESCRIPTION OF THE PREFERRED EMBODIMENT

Figure 1:
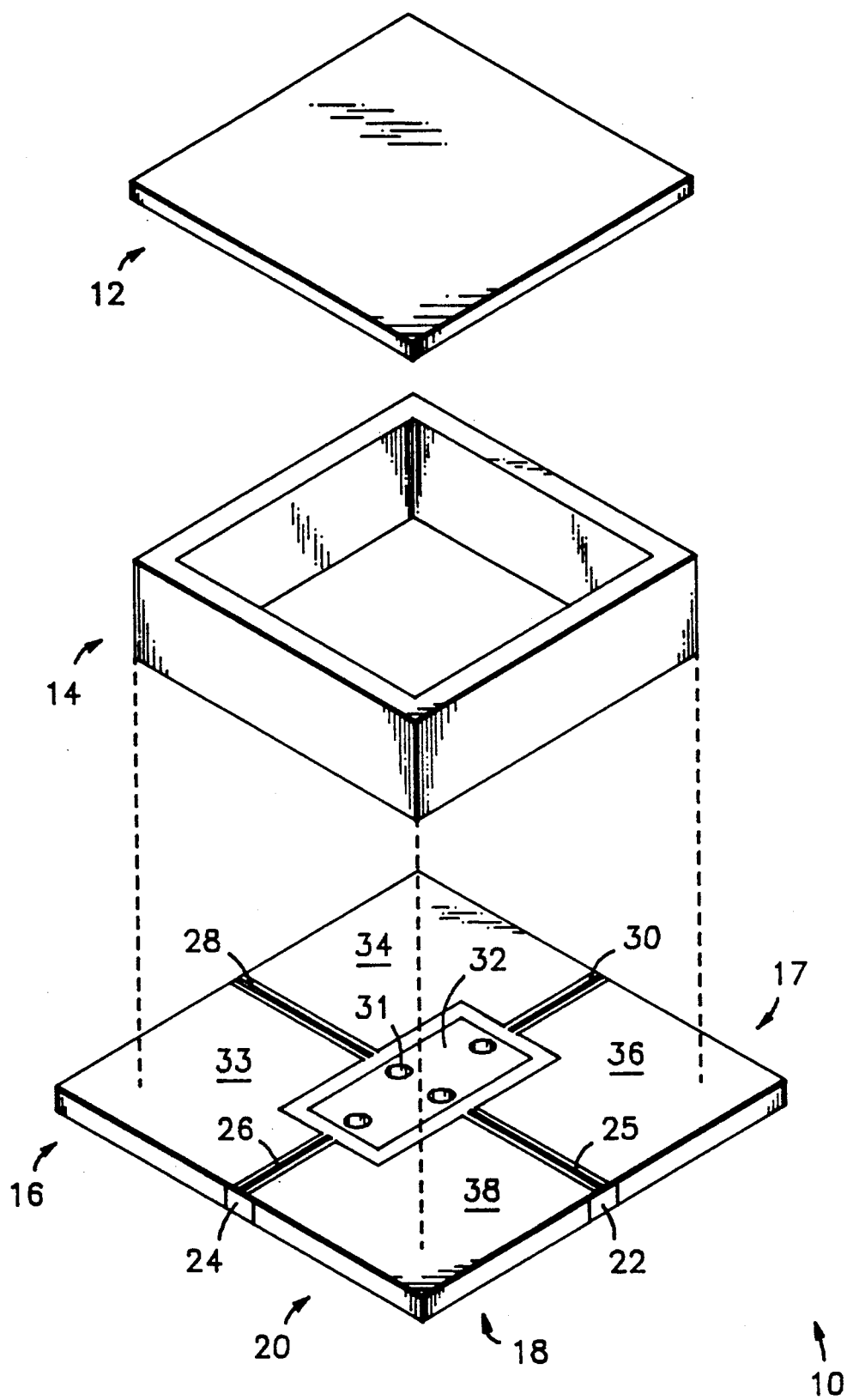
FIG. 1 is an exploded isometric view of a MMIC package in accordance with one embodiment of the invention.

FIG. 1 illustrates an exploded isometric view of package 10 for MMICS or other high frequency semiconductor devices. Package 10 includes cover 12, seal frame 14 and base 16. These parts can have rectangular, square or other shaped top views and these parts can be made of a ceramic material such as alumina. Ceramic base 16 has all surfaces thereof at least partially covered by a thin gold layer which may be applied in a known manner such as by sputtering along with the well-known technique of silk screening to provide desired patterns in the top surface 17 and end surfaces, eg. 18. Alternatively, top surface 17 and the end surfaces, eg. 18, can be completely coated with a gold layer and then masked and etched in a known manner to provide the desired gold patterns. Gold layer 19 on the flat bottom surface of ceramic base 16 is not patterned. A cross section of package 10 including layer 19 is shown in FIG. 3. End portions of base 16 such as surfaces 18 and 20 are covered with gold except for exposed ceramic areas such as 22 and 24 beneath leads or conductors 25 and 26, respectively. These exposed ceramic areas 22 and 24 prevent the leads or conductors from being shorted out. Leads 28 and 30 also have exposed end areas (not shown) of ceramic material beneath them to prevent shorting.

Holes 31 are plated through base 16 to facilitate heat flow from a semiconductor chip or chips mounted on rectangular pad 32. Gold plated ground plane portions 33, 34, 36 and 38 are connected by the gold on the end surfaces of base 16 to the gold plated bottom surface 19. Coplanar waveguide lines 25, 26, 28 and 30 on the top of base 16 are designed to provide 50 ohm impedances at the input and output terminals or ports thereof to facilitate maximum power transfer and to minimize interface problems. The thickness of base 16 and the thickness an spacing of conductor 25, for instance, relative to metallized ground plane areas 36 and 38 are selected in a known manner to provide the desired impedances.

FIG. 2 is a top view of the structure of FIG. 1 without cover 12. Seal frame 14 is positioned on ceramic base 16 and sealed into place by sealing glass, for instance, which is applied in a known manner. Lines 25, 26, 28 and 30 run underneath seal frame 14. Ceramic base 16 has a square shape having approximately 350 mils (thousands of an inch) along each side dimension, eg. 40. The top view of ceramic seal frame 14 is likewise square having sides of length 46 of approximately 250 mils. Holes 31 have diameters of 10 mils. Base 16 has a flat top surface with straight edges for abutting against the straight edge of another object. Lines 25, 26, 28 and 30 extend to but do not overlap the straight edges of base 16.

FIG. 3 shows a cross-sectional view along leads 25 and 28 of the structure shown in FIG. 2. The thickness of flat, square cover 12 as indicated by distance 52 is on the order of 10 mils. The height or thickness of seal frame 14 is 100 mils as indicated by distance 54 and the thickness of base 16 as indicated by distance 56 is 10 mils. Furthermore, as indicated by distance 58, the thickness of seal frame 14 is 15 mils. Semiconductor die pad 32 is located centrally on the flat top surface of metallized base 16.

Figure 4:
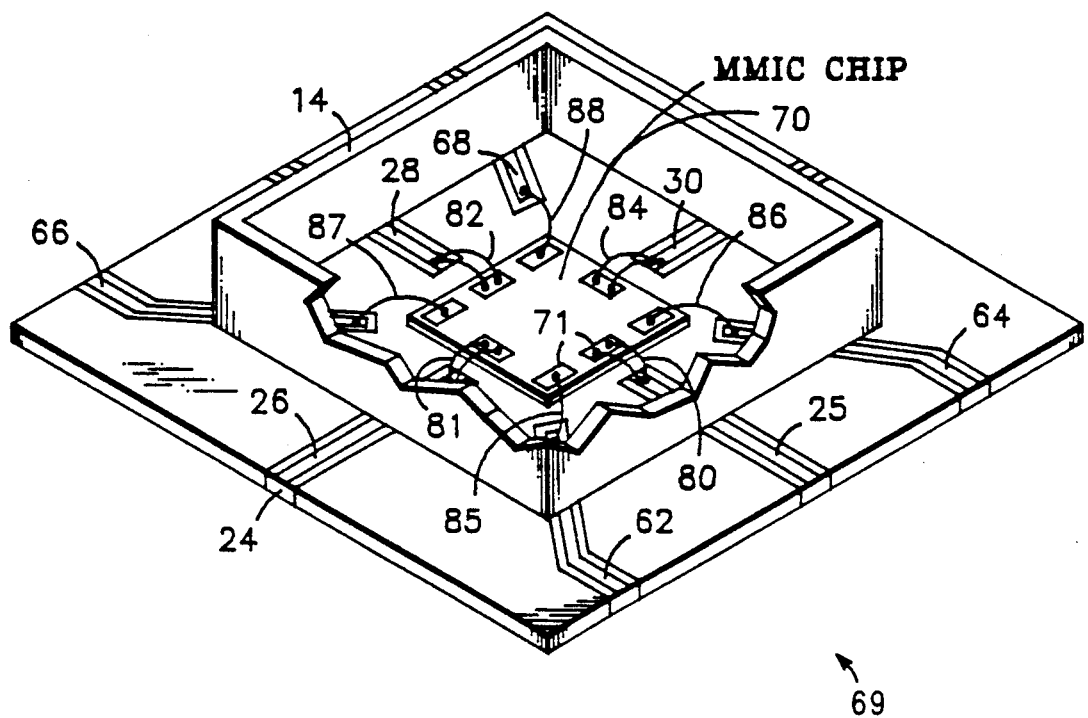
FIG. 4 is an isometric view part of another package showing the location of the semiconductor chip and additional ends.

FIG. 4 is a top view of package 69 which is similar to package 10 described in FIGS. 1, 2 and 3 without cover 12, but with additional microstrip lines 62, 64, 66 and 68 radially extending from pad 32 toward the edges of base 16. Furthermore, semiconductor chip 70 is shown in FIG. 4 as being diebonded to pad 32 in a known manner using epoxy or solder bonding. Conductive pads 71 on chip 70 are wirebonded in a known manner to the ends of conductors 25, 26, 28, 30, 62, 64, 66 and 68 by respective wirebonds 80, 81, 82, 84, 87 and 88. After chip 70 has been diebonded and wirebonded, the chip is electrically tested. If the test is satisfactory, cover 12 is glass sealed to seal frame 14 by sealing glass 90 as indicated in FIG. 3 so that base 16, frame 14 and cover 12 enclose and protect semiconductor die 70.

Figure 5:
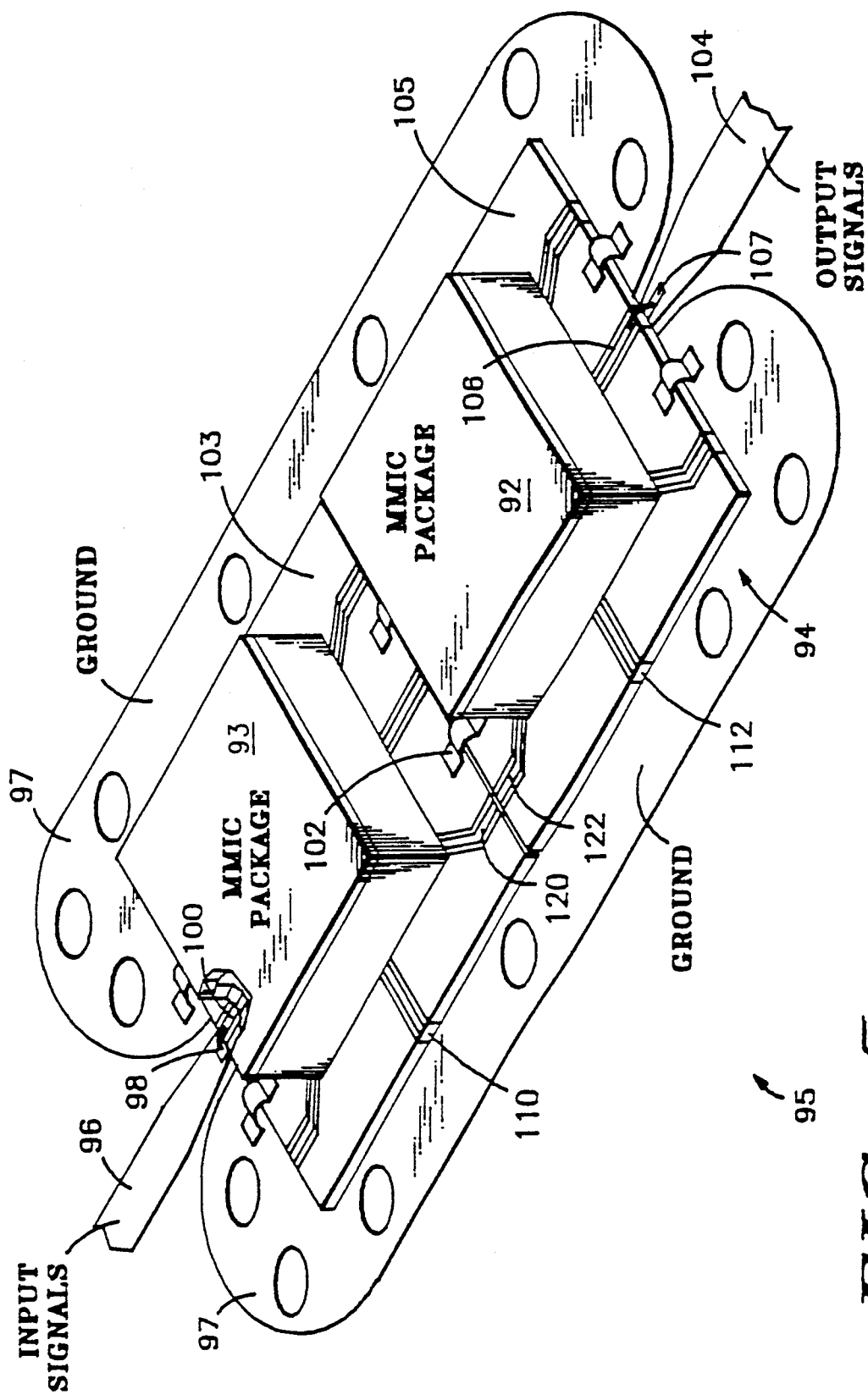
FIG. 5 is an isometric view of an electronic subassembly having two packages in accordance with the invention which had been mounted in abutting relationship to one another to minimize the size of the resulting product.

FIG. 5 shows MMIC coplanar waveguide packages 93 and 92 which have common edges abutted against each other. These packages are fastened to flat copper carrier 94 of module or subassembly 95. Input stripline conductor 96 provides input signals for the devices in cascaded packages 93 and 92. Rounded surfaces 97 provide matching compensation between stripline 96 and the coplanar waveguide conductor 100. Conductor 96 is connected to waveguide 100 by silver ribbon 98 which can be soldered or welded to the top surfaces of conductor 96 and input conductor 100 of package 90. Similarly, silver ribbon 102 provides connection between coplanar ground planes 103 and 105 on the top surfaces of packages 93 and 92. This simplifies fabrication as compared to if the bottoms of the packages had to be interconnected as is the technique in some prior art applications. Thus, coplanar packages 93 and 92 allows mounting in a smaller area than such other available packages. Some of the conductive lines, eg. 100 and 106, of packages 90 and 92 can conduct RF and others, eg. 110 and 112, can conduct DC power supply potentials and currents. These lines have similar widths and thicknesses to facilitate product layout. Output signal conductor 104 is connected to output line 106 of package 92 by silver ribbon 107. Aligned conductors 120 and 122 of respective packages 93 and 92 can also be connected by silver ribbon (not shown).

As further illustrated in FIG. 5, the close proximity of packages 92 and 93 allow designers to take advantage of the reduction in size inherent in MMIC circuits by also reducing the size of the final product configuration. Packages 92 and 93 of the invention do not have external leads which otherwise would increase the size of the final product configuration because they must be brought down upon carrier 94 and then brought back up into adjacent packages thus requiring space between the adjacent packages. This would undesirably increase the sizes of modules and hence the size of final product configurations using prior such art packages.

The disclosed packages 10, 69, 92, and 93 are suitable for use with modules, subassemblies, subsystems and systems employing MMIC technology. Nearly all types of MMIC circuits such as amplifiers, phase shifters, attenuators, etc. can be mounted in packages 10, 69, 90 and 93. These packages can be hermetically sealed using ceramic glass sealing 12 between cover 90 and frame 14 and glass sealing 91 between frame 14 and base 16 as shown in FIG. 3 so that these packages meet MIL SPEC 883, for instance. The disclosed packages have low cost and a capability of operating over wide frequency ranges such as from DC to 20 gigahertz. Although package 69 of FIG. 4 has 8 leads, it is apparent to those skilled in the art that an even greater number of leads can be accommodated by the package shown. Plated through holes 70 enable heat transfer between the chip 70 and carrier 94.

Thus, it is apparent to one skilled in the art that semiconductor packages in accordance with the invention have been described that fully satisfy the objects, aims and advantages as set forth above. More specifically, packages 10 and 69 can enclose high frequency, semiconductor devices and enable fabrication of compact final subassembly 95 by allowing the packages thereof to be mounted side-by-side with substantially no space therebetween. Either of packages 10 or 69 is capable of operating with wide bandwith, high frequency semiconductor die. Top surfaces of ground planes 103 and 105 are easily connected together. Plated through holes 70 facilitate heat flow from a semiconductor chip 70 mounted on pad 32. The resulting packages facilitate the manufacture of subassembly 95, for instance, by low cost techniques.

While the invention has been described in conjunction with specific embodiments thereof, it is evident that many alterations, modifications and variations will be apparent to those skilled in the art in light of the foregoing description. Accordingly, the invention is intended to embrace all such alterations, modifications and variations in the appended claims.

I claim:

1. A coplanar waveguide package for a semiconductor device which package is suitable for abutting against an adjacent coplanar waveguide structure having an edge with a predetermined shape so that electrical connection can be made therewith and so that the resulting structure takes up a minimal amount of space, the coplanar waveguide package including in combination:

base means having a first surface, a second surface and at least one edge having a shape adapted for abutting against the edge of the adjacent coplanar waveguide structure;

first conductive means provided on said first surface of said base means, said first conductive means adapted to extend to but not overlap said at least one edge, said first conductive means thereby being adapted to facilitate electrical contact with the adjacent coplanar waveguide structure;

first ground plane means also provided on said first surface of said base means, said first ground plane means being coplanar with and adjacent said first conductive means, said ground plane means and said first conductive means providing a coplanar waveguide means;

semiconductor die means coupled to said first conductive means;

semiconductor die pad means provided on said first surface of said base means, said semiconductor die pad means being adapted to receive said semiconductor die means;

frame means affixed to said base means and surrounding said semiconductor die means and said semiconductor die pad means;

cover means covering said frame means and said semiconductor die means and said semiconductor die pad means, said cover means being adapted to be affixed to said frame means; and said base means and said frame means and said cover means being adapted to enclose and protect said semiconductor die means.

2. The package of claim 1 wherein said base means has a flat rectangular first surface having a straight edge for abutting against a similar edge of the adjacent coplanar waveguide structure to facilitate electrical connection therewith; and said first conductive means and said first ground plane means being formed by patterning a conductive layer provided on said flat first surface of said base means.

3. The package of claim 1 wherein said semiconductor die mounting pad means is centrally located on said first surface of said base means.

4. The package of claim 1 wherein:

said frame means has a rectangular shape and is mounted on said first surface of said base means so as to surround said semiconductor die pad means; and said first conductive means extends radially from said semiconductor die pad means toward said edge of said base means and underneath said frame means.

5. The package of claim 4 wherein said cover means has a rectangular shape which is similar to the shape of said frame means.

6. A coplanar waveguide electronic assembly for high frequency operation including in combination:

carrier means having a flat conductive surface;

first base means having a flat first surface with a conductive layer thereon and a flat second surface and a shaped edge for abutting against a similar edge of an adjacent structure, said conductive layer on said first surface of said first base means being affixed to said surface of said carrier means;

ground plane means located on said flat second surface of said first base means;

conductive means also provided on said flat second surface of said first base means, said conductive means having a conductive line which extends nearly to but does not overlap said edge of said flat second surface of said first base means, said conductive means being coplanar with and adjacent said ground plane means to provide a waveguide structure;

semiconductor die pad means mounted on said flat second surface of said first base means;

semiconductor die means affixed to said semiconductor die pad means;

frame means affixed to said first base means and surrounding said semiconductor die pad means and said semiconductor die means; and cover means for covering portions of said first base means and said frame means and said semiconductor die and said semiconductor die pad means to provide a first package.

7. The electronic assembly of claim 6 further including an additional package for another semiconductor device, the additional package abutting against said first package so that the resulting structure takes up a minimum amount of space, said electronic assembly further including in combination:

second base means having a flat first surface with a conductive layer thereon and a flat second surface and a further shaped edge for abutting against said shaped edge of said first base means;

further ground plane means located on said flat second surface of said second base means;

further conductive means provided on said flat second surface of said second base means, said further conductive means having a further conductive line which is adapted to extend nearly to but to not overlap said shaped edge of said second base means, said further conductive line being aligned with said conductive line on said first base means, said further conductive means being coplanar with and adjacent said further ground plane means to provide another waveguide structure;

first conductor means electrically interconnecting said aligned conductive lines of said first and second base means;

second conductor means electrically interconnecting said ground plane means and said further ground plane means;

further semiconductor die pad means provided on said flat second surface of said second base means;

further semiconductor die means affixed to said further semiconductor die means;

further frame means affixed to said second base means and surrounding said further semiconductor die means and said further semiconductor die pad means;

further cover means for covering said further frame means and said further semiconductor die and said further semiconductor die pad means, said further cover means being affixed to said further frame means; and said first and second base means thereby being electrically and mechanically connected together on said carrier means in a manner to minimize the space taken up on said surface of said carrier means to thereby facilitate the assembly taking up a minimum amount of space.

8. The package of claim 1 where the adjacent coplanar waveguide structure is a further package for another semiconductor device, the further package including in combination:
further base means having a first surface with a shaped edge adapted for abutting against said at least one edge of said base means;
third conductive means provided on said first surface of said further base means, said third conductive means adapted to extend to said shaped edge, said third conductive means being aligned with said first conductive means; and
means making electrical contact between said first conductive means and said third conductive means.

9. The package of claim 1 further including second ground plane means on said second surface of said base means.

10. The package of claim 9 including:
further conductive means placed on an edge of said base means, said further conductive means interconnecting said first and second ground plane means.

11. A coplanar waveguide package for a semiconductor device, comprising:
an insulating base having opposed first and second surfaces and an edge extending therebetween;
a first metallization on the first surface; and
a second metallization on the second surface, wherein the second metallization has a central region for receiving a semiconductor die, at least two signal conductor regions separated from the central region and extending therefrom toward but not overlapping said edge, and at least two ground plane regions spaced apart from said two signal conductor regions and coplanar therewith and extending therefrom toward and overlapping said edge so that said ground plane regions make conductive contact with said first metallization.

12. The package of claim 11 further including:
a semiconductor die located on said central region; and
further means electrically coupling said die to each of said signal conductor regions.

13. The package of claim 11 wherein said second surface is substantially planar.

14. The package of claim 11 wherein said ground plane regions are substantially uniformly spaced from said signal conductor regions.

15. The package of claim 14 wherein said ground plane regions substantially cover said second surface except for said signal conductor regions and said substantially uniform space separating said ground conductor regions from said signal conductor regions.

16. The package of clam 14 wherein said portions of said ground plane regions extending over said edge substantially cover said edge except for portions of said edge adjacent ends of said signal conductor regions.

17. The package of claim 14 wherein said signal conductor regions and said ground plane regions form a coplanar waveguide having a characteristic impedance of above fifty ohms.

18. The package of claim 11 wherein said central region is included in the same plane as said signal conductor regions and said ground plane regions.

19. The package of claim 11 further including:
frame means affixed to said base and surrounding said central region; and cover means covering said frame means.

20. The package of claim 11 wherein said edge has a shape adapted for abutting against the edge of an adjacent coplanar waveguide structure.

21. The package of claim 11 wherein said ground plane means are partially adjacent to said signal conductor means.

* * * * *